United States Patent
Takata et al.

(10) Patent No.: US 8,791,774 B2
(45) Date of Patent: Jul. 29, 2014

(54) BRANCHING FILTER

(75) Inventors: Toshiaki Takata, Nagaokakyo (JP);
Shigeyuki Fujita, Nagaokakyo (JP)

(73) Assignee: Murata Manufacturing Co., Ltd.,
Kyoto (JP)

( * ) Notice: Subject to any disclaimer, the term of this patent is extended or adjusted under 35 U.S.C. 154(b) by 20 days.

(21) Appl. No.: 13/547,082

(22) Filed: Jul. 12, 2012

(65) Prior Publication Data

US 2012/0274418 A1    Nov. 1, 2012

Related U.S. Application Data

(63) Continuation of application No. PCT/JP2010/060725, filed on Jun. 24, 2010.

(30) Foreign Application Priority Data

Jan. 28, 2010   (JP) ................. 2010-017180

(51) Int. Cl.
*H03H 9/72*    (2006.01)
*H03H 9/64*    (2006.01)
*H03H 9/05*    (2006.01)
*H03H 9/00*    (2006.01)
*H03H 9/02*    (2006.01)

(52) U.S. Cl.
CPC .......... *H03H 9/725* (2013.01); *H03H 9/0576* (2013.01); *H03H 9/0085* (2013.01); *H03H 9/02913* (2013.01)
USPC ................. 333/133; 333/193; 333/195

(58) Field of Classification Search
USPC ........................... 333/133, 193–196
See application file for complete search history.

(56) References Cited

U.S. PATENT DOCUMENTS

| | | | |
|---|---|---|---|
| 7,030,716 B2 * | 4/2006 | Tsutsumi et al. | 333/133 |
| 7,078,989 B2 * | 7/2006 | Inoue et al. | 333/195 |
| 7,119,634 B2 * | 10/2006 | Sakano et al. | 333/133 |
| 7,425,878 B2 * | 9/2008 | Inoue et al. | 333/133 |
| 7,425,879 B2 * | 9/2008 | Taniguchi | 333/133 |
| 7,619,491 B2 * | 11/2009 | Takata et al. | 333/133 |
| 7,804,380 B2 * | 9/2010 | Funahashi et al. | 333/133 |
| 7,872,548 B2 * | 1/2011 | Nishihara et al. | 333/133 |

(Continued)

FOREIGN PATENT DOCUMENTS

| | | |
|---|---|---|
| JP | 2003-249842 A | 9/2003 |
| JP | 2005-294891 A | 10/2005 |

(Continued)

OTHER PUBLICATIONS

English language machine translation of JP 2005-294891, published Oct. 20, 2005.*

(Continued)

*Primary Examiner* — Barbara Summons
(74) *Attorney, Agent, or Firm* — Keating & Bennett, LLP

(57) ABSTRACT

A branching filter includes a ladder-type elastic wave filter unit connected between an antenna terminal and a transmission signal terminal and a longitudinally coupled resonator-type elastic wave filter unit connected between an antenna terminal and first and second balanced reception signal terminals while maintaining the isolation characteristics between the transmission signal terminal and the first and second reception signal terminals. In a duplexer, a transmission signal propagation direction is perpendicular or substantially perpendicular to each of a first reception signal propagation direction and a second reception signal propagation direction.

5 Claims, 8 Drawing Sheets

(56) References Cited

U.S. PATENT DOCUMENTS

| | | | |
|---|---|---|---|
| 7,880,561 B2 * | 2/2011 | Takamine | 333/133 |
| 7,924,118 B2 * | 4/2011 | Yonekura | 333/133 |
| 2004/0155730 A1 | 8/2004 | Iwamoto et al. | |
| 2007/0159269 A1 | 7/2007 | Taniguchi | |
| 2008/0266023 A1 * | 10/2008 | Tanaka | 333/133 |

FOREIGN PATENT DOCUMENTS

| JP | 2006-157174 | * | 6/2006 |
| JP | 2006-157174 A | | 6/2006 |
| JP | 2007-189390 A | | 7/2007 |
| JP | 2009-130627 A | | 6/2009 |

OTHER PUBLICATIONS

Official Communication issued in International Patent Application No. PCT/JP2010/060725, mailed on Aug. 3, 2010.

* cited by examiner

BRANCHING FILTER

BACKGROUND OF THE INVENTION

1. Field of the Invention

The present invention relates to a branching filter and, in particular, to a branching filter including a ladder-type elastic wave filter unit connected between an antenna terminal and a transmission signal terminal and a longitudinally coupled resonator-type elastic wave filter unit connected between the antenna terminal and first and second balanced reception signal terminals.

2. Description of the Related Art

In recent years, elastic wave branching filters using elastic waves, such as surface acoustic waves or boundary acoustic waves, have been widely used as a branching filter for branching transmission signals to be transmitted through an antenna and reception signals received through the antenna.

For example, Japanese Unexamined Patent Application Publication No. 2007-189390 describes a duplexer using a highly power-resistant, ladder-type elastic wave filter as a transmission filter and using a longitudinally coupled resonator-type elastic wave filter with the balanced-unbalanced transforming function as a reception filter.

Since a duplexer as described in Japanese Unexamined Patent Application Publication No. 2007-189390 is miniaturized, a change in the disposition of the ladder-type elastic wave filter or longitudinally coupled resonator-type elastic wave filter may deteriorate the isolation characteristic between a transmission signal terminal to which the ladder-type elastic wave filter is connected and first and second reception signal terminals to which the longitudinally coupled resonator-type elastic wave filter is connected.

SUMMARY OF THE INVENTION

In view of the foregoing, preferred embodiments of the present invention provide a miniaturized branching filter including a ladder-type elastic wave filter unit connected between an antenna terminal and a transmission signal terminal and a longitudinally coupled resonator-type elastic wave filter unit connected between the antenna terminal and first and second balanced signal terminals while maintaining the isolation characteristic between the transmission signal terminal and the first and second reception signal terminals.

A branching filter according to a preferred embodiment of the present invention includes an antenna terminal, a transmission signal terminal, a reception signal terminal, a ladder-type elastic wave filter unit, and a longitudinally coupled resonator-type elastic wave filter unit. The ladder-type elastic wave filter unit is connected between the antenna terminal and the transmission signal terminal. The longitudinally coupled resonator-type elastic wave filter unit is connected between the antenna terminal and the reception signal terminal. The ladder-type elastic wave filter unit includes series arm resonators and a parallel arm resonator. The series arm resonators are connected in series with each other between the antenna terminal and the transmission signal terminal. The series arm resonators define a series arm. The parallel arm resonator is connected between the series arm and a ground potential. The longitudinally coupled resonator-type elastic wave filter unit includes first and second functional electrode units. The first and second functional electrode units each include at least one IDT electrode connected between the antenna terminal and the reception signal terminal. A transmission signal propagation direction is perpendicular or substantially perpendicular to each of first and second reception signal propagation directions. The transmission signal propagation direction is perpendicular or substantially perpendicular to an elastic wave propagation direction in the series arm resonators. The first reception signal propagation direction is perpendicular or substantially perpendicular to an elastic wave propagation direction in the first functional electrode unit. The second reception signal propagation direction is perpendicular or substantially perpendicular to an elastic wave propagation direction in the second functional electrode unit. The ladder-type filter unit preferably has an elongated shape whose length direction extends along the transmission signal propagation direction. The longitudinally coupled resonator-type elastic wave filter unit preferably has an elongated shape whose length direction extends along elastic wave propagation directions in the first and second functional electrode units.

In a particular aspect of the branching filter according to a preferred embodiment of the present invention, the ladder-type elastic wave filter unit further includes a piezoelectric substrate including the series arm resonators and the parallel arm resonator provided thereon. The longitudinally coupled resonator-type elastic wave filter unit further includes a piezoelectric substrate including the first and second functional electrode units provided thereon. The piezoelectric substrate of the ladder-type elastic wave filter unit preferably has a rectangular shape whose length direction extends along the transmission signal propagation direction. The piezoelectric substrate of the longitudinally coupled resonator-type elastic wave filter unit preferably has a rectangular shape whose length direction extends along the elastic wave propagation directions in the first and second functional electrode units.

In another particular aspect of the branching filter according to a preferred embodiment of the present invention, the first functional electrode unit includes a first longitudinally coupled resonator-type elastic wave element unit including IDT electrodes disposed along an elastic wave propagation direction. The second functional electrode unit includes a second longitudinally coupled resonator-type elastic wave element unit including IDT electrodes disposed along an elastic wave propagation direction. The first and second longitudinally coupled resonator-type elastic wave element units are disposed along the elastic wave propagation directions in the first and second longitudinally coupled resonator-type elastic wave element units. According to this configuration, the branching filter can further be miniaturized.

In another particular aspect of the branching filter according to a preferred embodiment of the present invention, the first functional electrode unit further includes a third longitudinally coupled resonator-type elastic wave element unit. The third longitudinally coupled resonator-type elastic wave element unit is cascade-connected between the first longitudinally coupled resonator-type elastic wave element unit and the first reception signal terminal. The third longitudinally coupled resonator-type elastic wave element unit is disposed on one side of the first longitudinally coupled resonator-type elastic wave element unit in the first reception signal propagation direction. The second functional electrode unit further includes a fourth longitudinally coupled resonator-type elastic wave element unit. The fourth longitudinally coupled resonator-type elastic wave element unit is cascade-connected between the second longitudinally coupled resonator-type elastic wave element unit and the second reception signal terminal. The fourth longitudinally coupled resonator-type elastic wave element unit is disposed on one side of the second longitudinally coupled resonator-type elastic wave element unit in the second reception signal propagation direction.

In yet another particular aspect of the branching filter according to a preferred embodiment of the present invention, the reception signal terminal includes first and second reception signal terminals. The first functional electrode unit is connected between the antenna terminal and the first reception signal terminal. The second functional electrode unit is connected between the antenna terminal and the second reception signal terminal.

In yet another particular aspect of the branching filter according to a preferred embodiment of the present invention, the series arm resonators and the parallel arm resonator are disposed along the transmission signal propagation direction. According to this configuration, the branching filter can further be miniaturized.

According to various preferred embodiments of the present invention, the transmission signal propagation direction is perpendicular or substantially perpendicular to each of the first and second reception signal propagation directions. For this reason, electromagnetic coupling does not easily occur between the ladder-type elastic wave filter unit and the longitudinally coupled resonator-type elastic wave filter unit. Thus, even when miniaturizing the branching filter by rendering the respective length directions of the ladder-type elastic wave filter unit and the longitudinally coupled resonator-type elastic wave filter unit parallel or substantially parallel with each other, the isolation characteristic from the transmission signal terminal to the reception signal terminal can be favorably maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Now, a preferred embodiment of the present invention will be described using a duplexer 1 shown in FIG. 1 as an example. The duplexer 1 is only illustrative, and the branching filter according to a preferred embodiment of the present invention is not limited to the duplexer 1. The branching filter according to other preferred embodiments of the present invention may be, for example, a duplexer other than the duplexer 1 or triplexer.

The duplexer 1 according to the present preferred embodiment preferably is a UMTS-BAND-5 duplexer including a transmission filter having a passband (TX band) of about 824 MHz to about 849 MHz and a reception filter having a passband (RX band) of about 869 MHz to about 894 MHz, for example.

Figure 1:
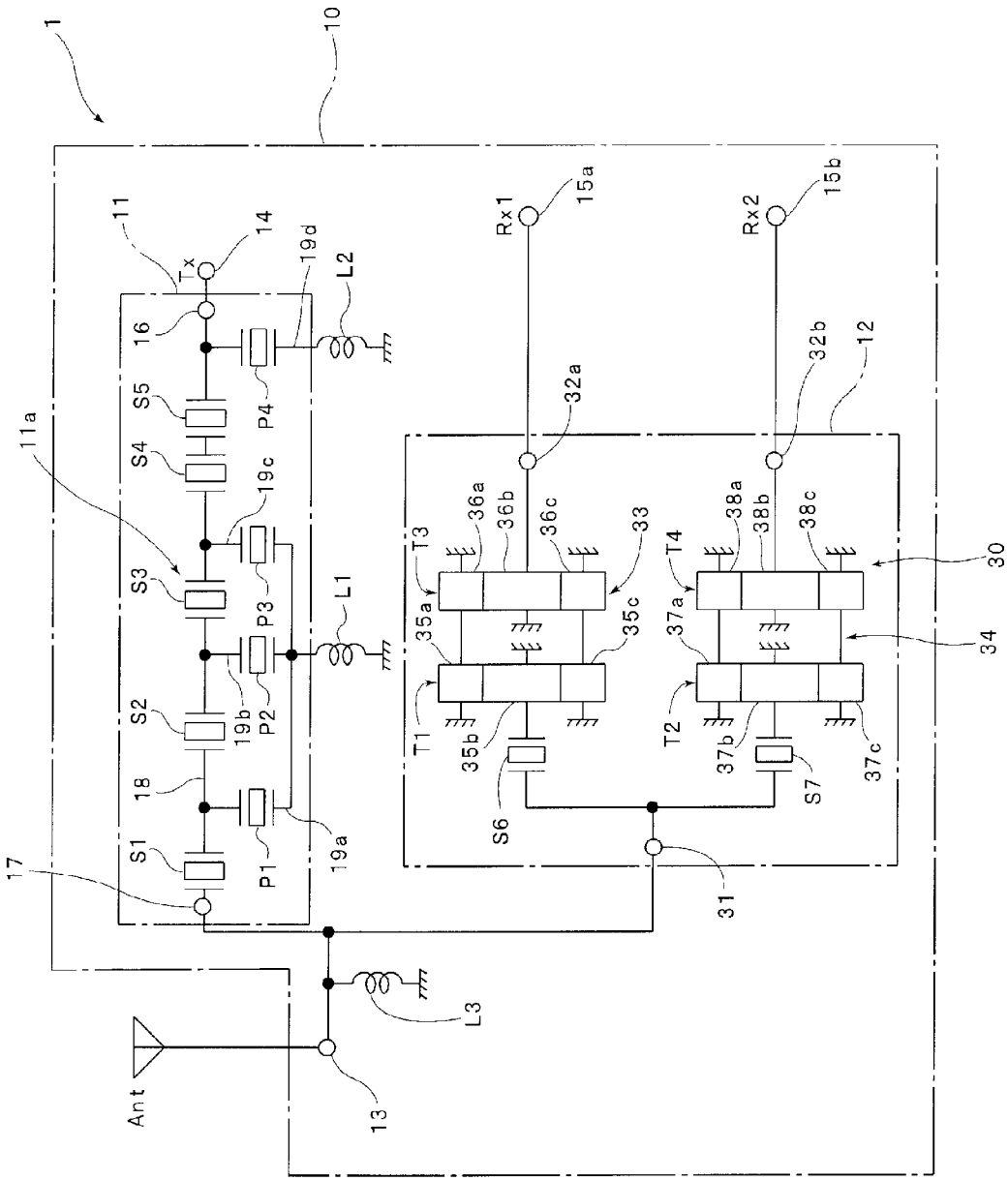
FIG. 1 is an equivalent circuit diagram of a duplexer according to a first preferred embodiment of the present invention.
Figure 2:
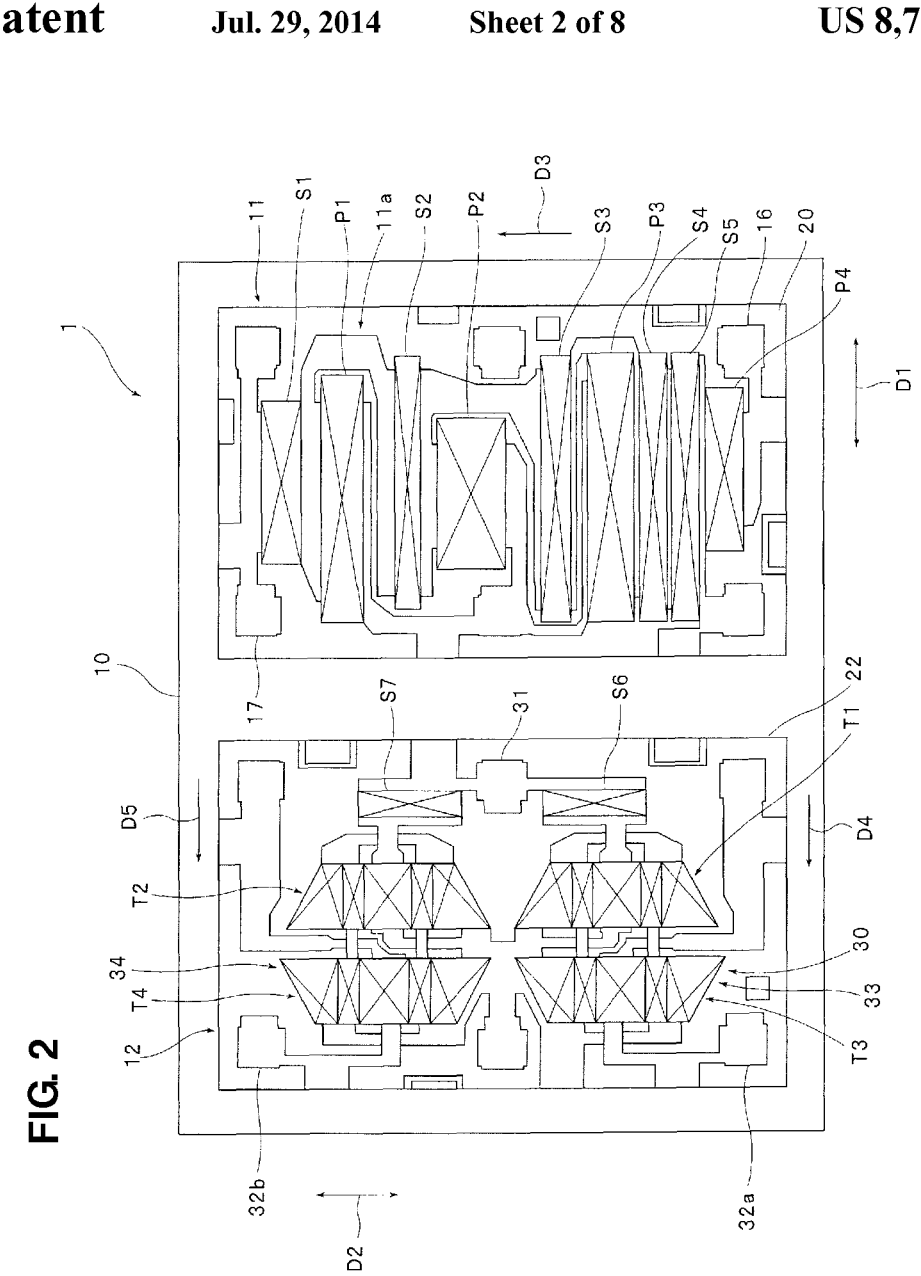
FIG. 2 is a schematic perspective plan view of the duplexer according to the first preferred embodiment of the present invention.
Figure 3:
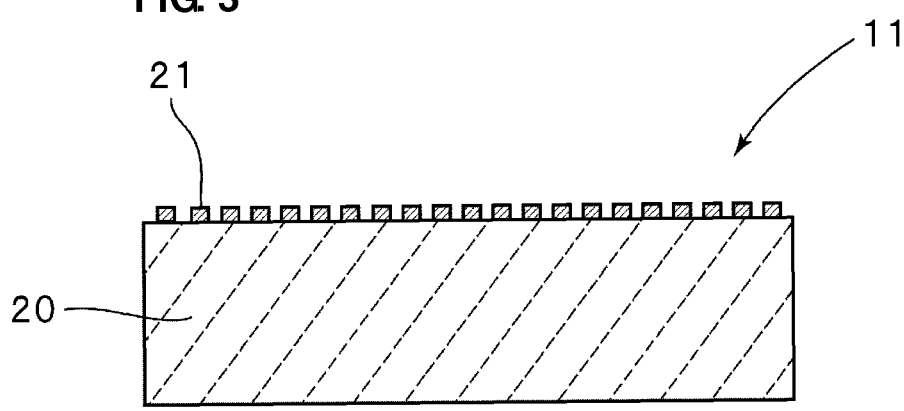
FIG. 3 is a schematic cross-sectional view of a ladder-type elastic wave filter chip according to the first preferred embodiment of the present invention.
Figure 4:
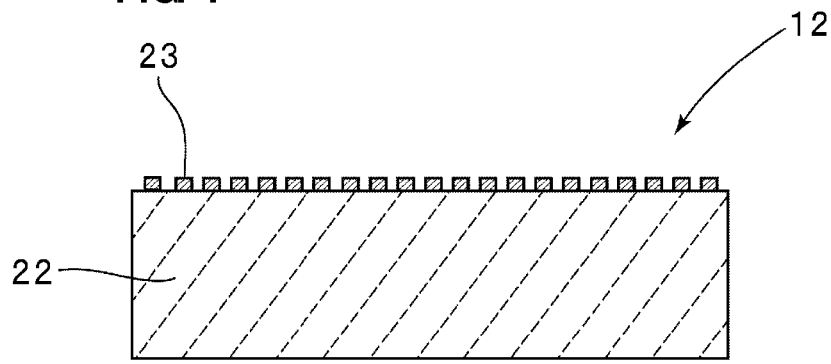
FIG. 4 is a schematic cross-sectional view of a longitudinally coupled resonator-type elastic wave filter chip according to the first preferred embodiment of the present invention.

FIG. 1 is an equivalent circuit diagram of the duplexer according to the first preferred embodiment. FIG. 2 is a schematic perspective plan view of the duplexer according to the first preferred embodiment. FIG. 3 is a schematic cross-sectional view of a ladder-type elastic wave filter chip. FIG. 4 is a schematic cross-sectional view of a longitudinally coupled resonator-type elastic wave filter chip. In FIGS. 1 and 2 and FIGS. 5 and 9 to be described later, resonators and IDT electrodes are shown schematically, and reflectors and the like are omitted.

As shown in FIG. 2, the duplexer 1 includes a wiring substrate 10, and a ladder-type elastic wave filter chip 11 and a longitudinally coupled resonator-type elastic wave filter chip 12 mounted on the wiring substrate 10.

As shown in FIG. 1, the wiring substrate 10 includes an antenna terminal 13 connected to an antenna, a transmission signal terminal 14, and first and second reception signal terminals 15a and 15b.

The ladder-type elastic wave filter chip 11 includes a ladder-type elastic wave filter unit 11a connected between the antenna terminal 13 and the transmission signal terminal 14. The ladder-type elastic wave filter unit 11a includes an input signal terminal 16 connected to the transmission signal terminal and an output signal terminal 17 connected to the antenna terminal 13. Series arm resonators S1 to S5 are connected in series with each other between the input signal terminal 16 and the output signal terminal 17. The series arm resonators S1 to S5 define a series arm 18. Parallel arm resonators P1 to P4 are connected between the series arm 18 and a ground potential. The parallel arm resonators P1 to P4 define parallel arms 19a to 19d. An inductor L1 is connected between the parallel arm resonators P1 to P3 and the ground potential. An inductor L2 is connected between the parallel arm resonator P4 and the ground potential.

In the present preferred embodiment, the ladder-type elastic wave filter chip 11 preferably is a ladder-type surface acoustic wave filter chip using surface acoustic waves. As shown in FIG. 3, the ladder-type elastic wave filter chip 11 includes a piezoelectric substrate 20 and an electrode structure 21 provided on the piezoelectric substrate 20. The electrode structure 21 preferably includes the series arm 18, the series arm resonators S1 to S5, the parallel arms 19a to 19d, the parallel arm resonators P1 to P4, and the like. The inductors L1 and L2 are disposed on the wiring substrate 10. An inductor L3 (see FIG. 1) connected between the junction between the ladder-type elastic wave filter unit 11a and the antenna terminal 13 and the ground potential is also disposed on the wiring substrate 10.

As shown in FIG. 1, the longitudinally coupled resonator-type elastic wave filter chip 12 includes a longitudinally coupled resonator-type elastic wave filter unit 30 connected between the antenna terminal 13a and the first and second reception signal terminals 15a and 15b. The longitudinally coupled resonator-type elastic wave filter unit 30 includes an input signal terminal 31 connected to the antenna terminal 13, a first output signal terminal 32a connected to the first reception signal terminal 15a, and a second output signal terminal 32b connected to the second reception signal terminal 15b. The longitudinally coupled resonator-type elastic wave filter unit 30 preferably is a so-called balanced filter unit with the balanced-unbalanced transforming function.

The longitudinally coupled resonator-type elastic wave filter unit 30 includes a first functional electrode unit 33 and a second functional electrode unit 34. The first functional electrode unit 33 is connected between the input signal terminal and the first output signal terminal 32a. The second functional electrode unit 34 is connected between the input signal terminal 31 and the second output signal terminal 32b.

The first functional electrode units 33 and the second functional electrode unit 34 each include at least one IDT electrode. Specifically, the first functional electrode unit 33 includes a first longitudinally coupled resonator-type elastic wave element unit T1, a third longitudinally coupled resonator-type elastic wave element unit T3, and a resonator S6. The first longitudinally coupled resonator-type elastic wave element unit T1 is disposed along an elastic wave propagation direction D2 (see FIG. 2) and, as shown in FIG. 1, includes IDT electrodes 35a to 35c each including a pair of comb-teeth-shaped electrodes. One of the comb-teeth-shaped electrodes of the IDT electrode 35b disposed centrally in the elastic wave propagation direction D2 is connected to the input signal terminal 31, and the other comb-teeth-shaped electrode is connected to the ground potential. One of the comb-teeth-shaped electrodes of each of the IDT electrodes 35a and 35c disposed on both sides in the elastic wave propagation direction D2 is connected to the ground potential, and the other comb-teeth-shaped electrode is connected to the third longitudinally coupled resonator-type elastic wave element unit T3.

The third longitudinally coupled resonator-type elastic wave element unit T3 is cascade-connected between the first longitudinally coupled resonator-type elastic wave element unit T1 and the first output signal terminal 32a. The third longitudinally coupled resonator-type elastic wave element unit T3 is disposed along the elastic wave propagation direction D2 (see FIG. 2) and includes IDT electrodes 36a to 36c each including a pair of comb-teeth-shaped electrodes. The IDT electrodes 36a and 36c are disposed on both sides in the elastic wave propagation direction D2, one comb-teeth-shaped electrode of the IDT electrode 36a and one comb-teeth-shaped electrode of IDT electrode 36c are connected to the IDT electrode 35a and IDT electrode 35c, respectively, of the first longitudinally coupled resonator-type elastic wave element unit T1, and the other comb-teeth-shaped electrodes are connected to the ground potential. One comb-teeth-shaped electrode of the IDT electrode 36b disposed centrally in the elastic wave propagation direction D2 is connected to the ground potential, and the other comb-teeth-shaped electrode is connected to the first output signal terminal 32a.

The resonator S6 is connected between the first longitudinally coupled resonator-type elastic wave element unit T1 and the input signal terminal 31.

The second functional electrode unit 34 includes a second longitudinally coupled resonator-type elastic wave element unit T2, a fourth longitudinally coupled resonator-type elastic wave element unit T4, and a resonator S7. The second longitudinally coupled resonator-type elastic wave element unit T2 is disposed along the elastic wave propagation direction D2 (see FIG. 2) and, as shown in FIG. 1, includes IDT electrodes 37a to 37c each including a pair of comb-teeth-shaped electrodes. One comb-teeth-shaped electrode of the IDT electrode 37b disposed centrally in the elastic wave propagation direction D2 is connected to the input signal terminal 31, and the other comb-teeth-shaped electrode is connected to the ground potential. The IDT electrodes 37a and 37c are disposed on both sides in the elastic wave propagation direction D2, one comb-shaped electrode of the IDT electrode 37a and one comb-shaped electrode of the IDT electrode 37c are connected to the ground potential, and the other comb-shaped electrodes are connected to the fourth longitudinally coupled resonator-type elastic wave element unit T4.

The fourth longitudinally coupled resonator-type elastic wave element unit T4 is cascade-connected between the second longitudinally coupled resonator-type elastic wave element unit T2 and the second output signal terminal 32b. The fourth longitudinally coupled resonator-type elastic wave element unit T4 is disposed along the elastic wave propagation direction D2 (see FIG. 2) and includes IDT electrodes 38a to 38c each including a pair of comb-teeth-shaped electrodes. One of the comb-teeth-shaped electrodes of each of the IDT electrodes 38a and 38c disposed on both sides in the elastic wave propagation direction D2 is connected to the IDT electrode 37a or IDT electrode 37c of the second longitudinally coupled resonator-type elastic wave element unit T2, and the other comb-teeth-shaped electrode is connected to the ground potential. One of the comb-teeth-shaped electrodes of the IDT electrode 38b disposed centrally in the elastic wave propagation direction D2 is connected to the ground potential, and the other comb-teeth-shaped electrode is connected to the second output signal terminal 32b.

The resonator S7 is connected between the second longitudinally coupled resonator-type elastic wave element unit T2 and the input signal terminal 31.

Like the ladder-type elastic wave filter chip 11, the longitudinally coupled resonator-type elastic wave filter chip is a longitudinally coupled resonator-type surface acoustic wave filter chip using surface acoustic waves. As shown in FIG. 4, the longitudinally coupled resonator-type elastic wave filter chip 12 includes a piezoelectric substrate 22 and an electrode structure 23 provided on the piezoelectric substrate 22. The electrode structure 23 preferably includes the above-mentioned first functional electrode unit 33, second functional electrode unit 34, and resonators S6 and S7. While, in this preferred embodiment, the piezoelectric substrate 22 of the longitudinally coupled resonator-type elastic wave filter chip 12 and the piezoelectric substrate 20 of the ladder-type elastic wave filter chip 11 are provided separately, the piezoelectric substrates 22 and 20 may be provided as a single substrate.

In this preferred embodiment, the material of the piezoelectric substrates 20 and 22 is not limited to a particular one. For example, the piezoelectric substrates 20 and 22 may be a $LiNbO_3$ substrate, $LiTaO_3$ substrate, crystal substrate, or other suitable substrate, for example. Similarly, in this preferred embodiment, the material of the electrode structures 21 and 23 is not limited to a particular one. The electrode structures 21 and 23 may be formed using a metal, such as Al, Pt, Au, Ag, Cu, Ti, Ni, Cr, or Pd, or conductive material, such as an alloy containing one or more of these metals, for example. Alternatively, the electrode structures 21 and 23 may be formed of a conductive film lamination where multiple conductive films are laminated.

Next, referring mainly to FIG. 2, the specific disposition of the components of the ladder-type elastic wave filter chip 11 and the longitudinally coupled resonator-type elastic wave filter chip 12 will be described.

As shown in FIG. 2, in the ladder-type elastic wave filter chip 11, the series arm resonators S1 to S5 and the parallel arm resonators P1 to P4 are disposed perpendicular or substantially perpendicular to an elastic wave propagation direction D1 in the series arm resonators S1 to S5 and also along a transmission signal propagation direction D3, which is the direction in which transmission signals propagate through the ladder-type elastic wave filter unit 11a. For this reason, in this preferred embodiment, the ladder-type elastic wave filter unit 11a has an elongated shape whose length direction is along the transmission signal propagation direction D3. Specifically, the ladder-type elastic wave filter chip 11 preferably has a rectangular or substantially rectangular shape whose longer sides extend along the transmission signal propagation direction D3. That is, the ladder-type elastic wave filter chip 11 preferably has a rectangular or substantially rectangular shape whose length direction is along the transmission signal propagation direction D3.

The fact that the series arm resonators S1 to S5 and the parallel arm resonators P1 to P4 are disposed along the transmission signal propagation direction D3 means that there is a straight line which is along the transmission signal propagation direction D3 and which passes through all the series arm resonators S1 to S5 and parallel arm resonators P1 to P4.

The ladder-type elastic wave filter chip 11 and the longitudinally coupled resonator-type elastic wave filter chip 12 are disposed along the elastic wave propagation direction D1.

The ladder-type elastic wave filter chip 11 and the longitudinally coupled resonator-type elastic wave filter chip 12 are disposed in such a manner that the filter chips overlap each other along the transmission signal propagation direction D3. In other words, the ladder-type elastic wave filter chip 11 and the longitudinally coupled resonator-type elastic wave filter chip 12 are disposed in such a manner that the filter chips overlap each other when seen from the elastic wave propagation direction D1 perpendicular to the transmission signal propagation direction D3.

In the longitudinally coupled resonator-type elastic wave filter chip 12, the first functional electrode unit 33 and the second functional electrode unit 34 of the longitudinally coupled resonator-type elastic wave filter unit 30 are disposed along the elastic wave propagation direction D2. Specifically, the first longitudinally coupled resonator-type elastic wave element unit T1 and the second longitudinally coupled resonator-type elastic wave element unit T2 are disposed along the elastic wave propagation direction D2. The third longitudinally coupled resonator-type elastic wave element unit T3 and the fourth longitudinally coupled resonator-type elastic wave element unit T4 disposed on sides of the first longitudinally coupled resonator-type elastic wave element unit T1 and the second longitudinally coupled resonator-type elastic wave element unit T2 in a direction perpendicular or substantially perpendicular to the elastic wave propagation direction D2 are disposed along the elastic wave propagation direction D2. Therefore, in this preferred embodiment, the longitudinally coupled resonator-type elastic wave filter unit 30 preferably has an elongated shape whose length direction extends along the elastic wave propagation direction D2. Specifically, the longitudinally coupled resonator-type elastic wave filter chip 12 preferably has a rectangular shape whose longer sides extend along the elastic wave propagation direction D2. That is, the longitudinally coupled resonator-type elastic wave filter chip preferably has a rectangular shape whose length direction extends along the elastic wave propagation direction D2.

Figure 9:
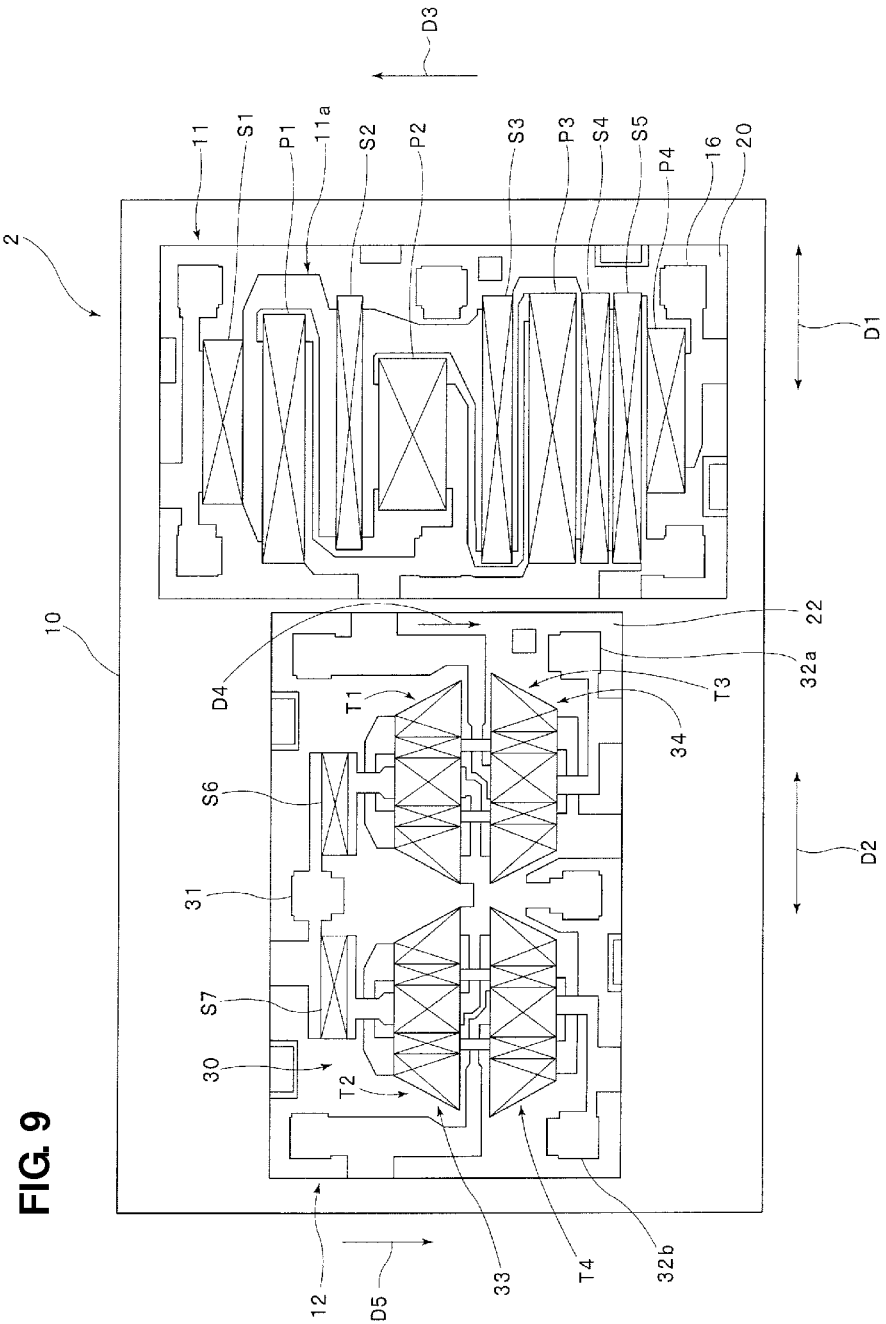
FIG. 9 is a schematic plan view of a duplexer according to a reference example.

In this preferred embodiment, the elastic wave propagation direction D2 is parallel or substantially parallel to the transmission signal propagation direction D3. Therefore, the ladder-type elastic wave filter chip 11 and the longitudinally coupled resonator-type elastic wave filter chip are disposed such that the respective length directions thereof are parallel or substantially parallel with each other. Accordingly, for example, as shown in FIG. 9, the area where the ladder-type elastic wave filter chip 11 and the longitudinally coupled resonator-type elastic wave filter chip 12 are disposed can be made smaller than that in a duplexer 2 according to a conventional reference example, where a ladder-type elastic wave filter chip 11 and a longitudinally coupled resonator-type elastic wave filter chip 12 are disposed such that the respective length directions thereof are perpendicular or substantially perpendicular to each other. Thus, the duplexer 1 can be miniaturized.

Further, in the present preferred embodiment, a first reception signal propagation direction D4 and a second reception signal propagation direction D5 are parallel or substantially parallel with each other, and the transmission signal propagation direction D3 is perpendicular or substantially perpendicular to each of the first reception signal propagation direction D4 and the second reception signal propagation direction D5. Accordingly, as demonstrated also in a working example below, the isolation characteristic between the transmission signal terminal 14, and the first reception signal terminal 15a and the second reception signal terminal 15b is good. The first reception signal propagation direction D4 is perpendicular or substantially perpendicular to the elastic wave propagation direction D2 in the first functional electrode unit and is the reception signal propagation direction in the first functional electrode unit 33. The second reception signal propagation direction D5 is perpendicular or substantially perpendicular to the elastic wave propagation direction D2 in the second functional electrode unit 34 and is the reception signal propagation direction in the second functional electrode unit 34.

Hereafter, the advantages of the present preferred embodiment will be described in more details on the basis of a specific example. A duplexer shown in FIG. 5 was prepared as a comparative example with the duplexer 1 according to the above-mentioned preferred embodiment. For the convenience of description, in the description of the comparative example show in FIG. 5, components having substantially the same functions as those in the above-mentioned preferred embodiment are referred to using the same numerals, and description thereof is omitted.

Figure 5:
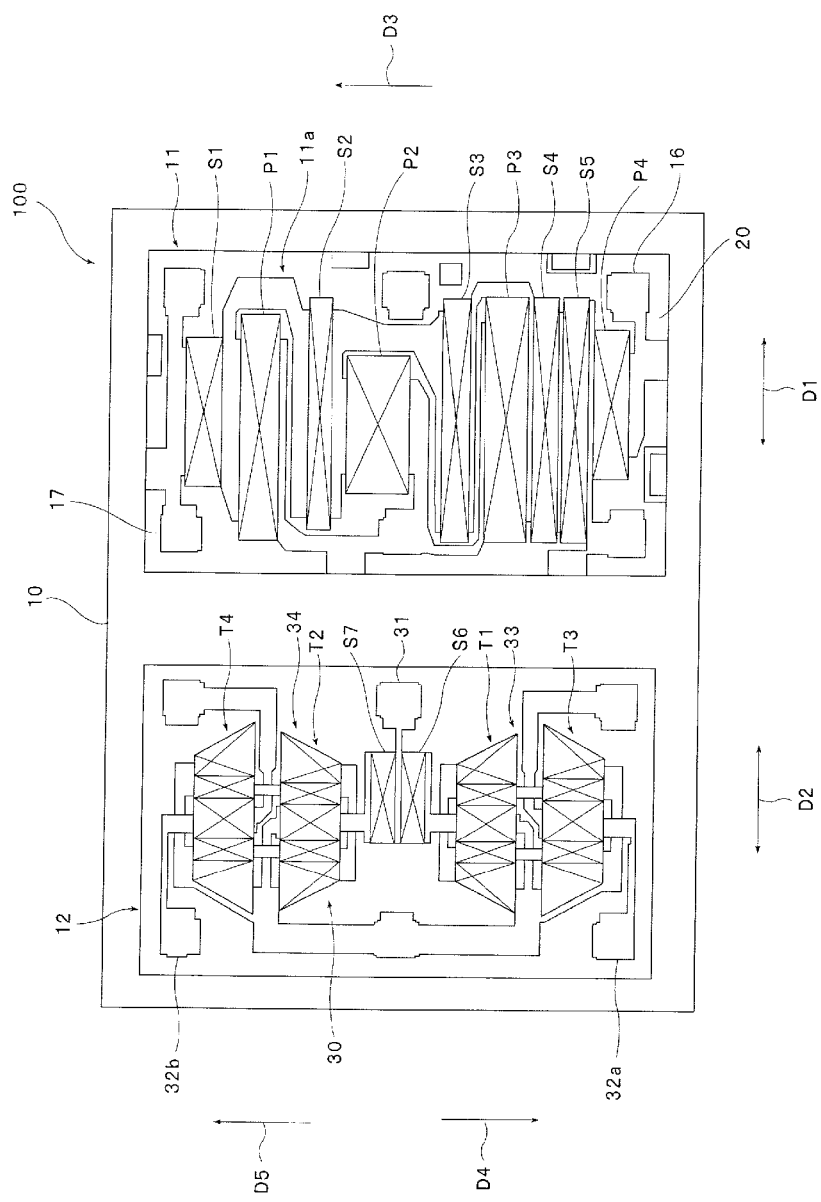
FIG. 5 is a schematic plan view of a duplexer according to a comparative example.

A duplexer 100 according to a comparative example shown in FIG. 5 has a configuration similar to that of the duplexer 1 according to the above-mentioned preferred embodiment except for the specific disposition of the components of a longitudinally coupled resonator-type elastic wave filter chip 12. In the comparative example, a first functional electrode unit 33 and a second functional electrode unit 34 are disposed such that a first reception signal propagation direction D4 is identical to a transmission signal propagation direction D3 and so that a second reception signal propagation direction D5 is opposite to a transmission signal propagation direction D3.

Figure 6:
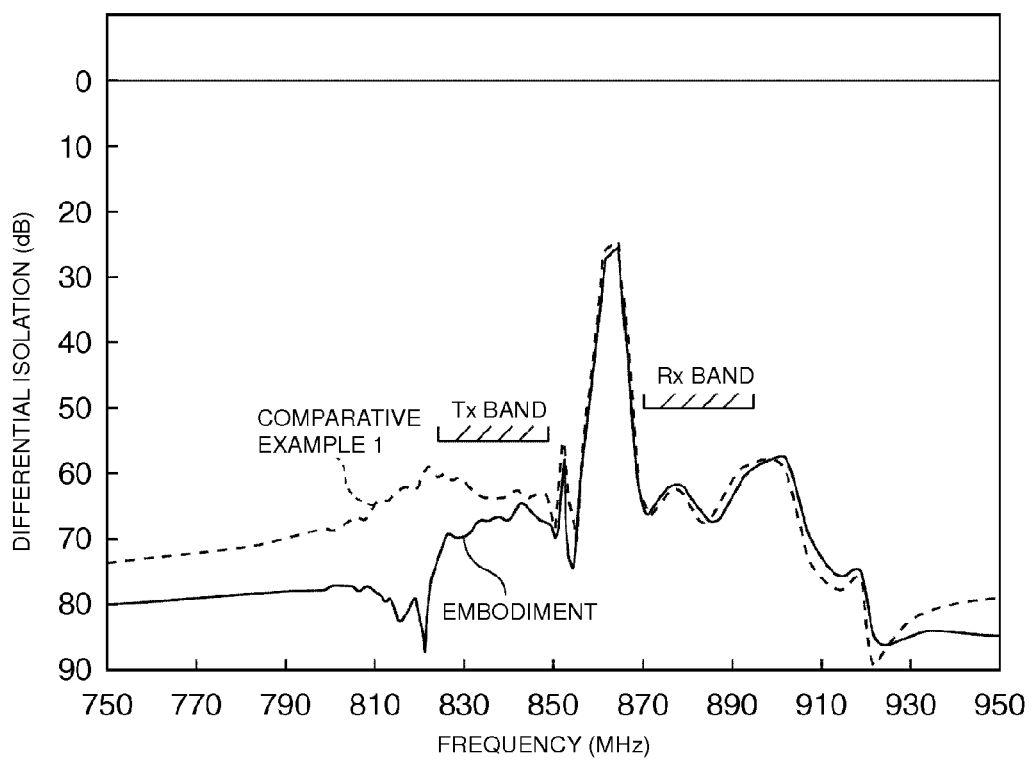
FIG. 6 is a graph showing the differential isolation characteristic of each of the duplexer according to the first preferred embodiment of the present invention and the duplexer according to the comparative example.
Figure 7:
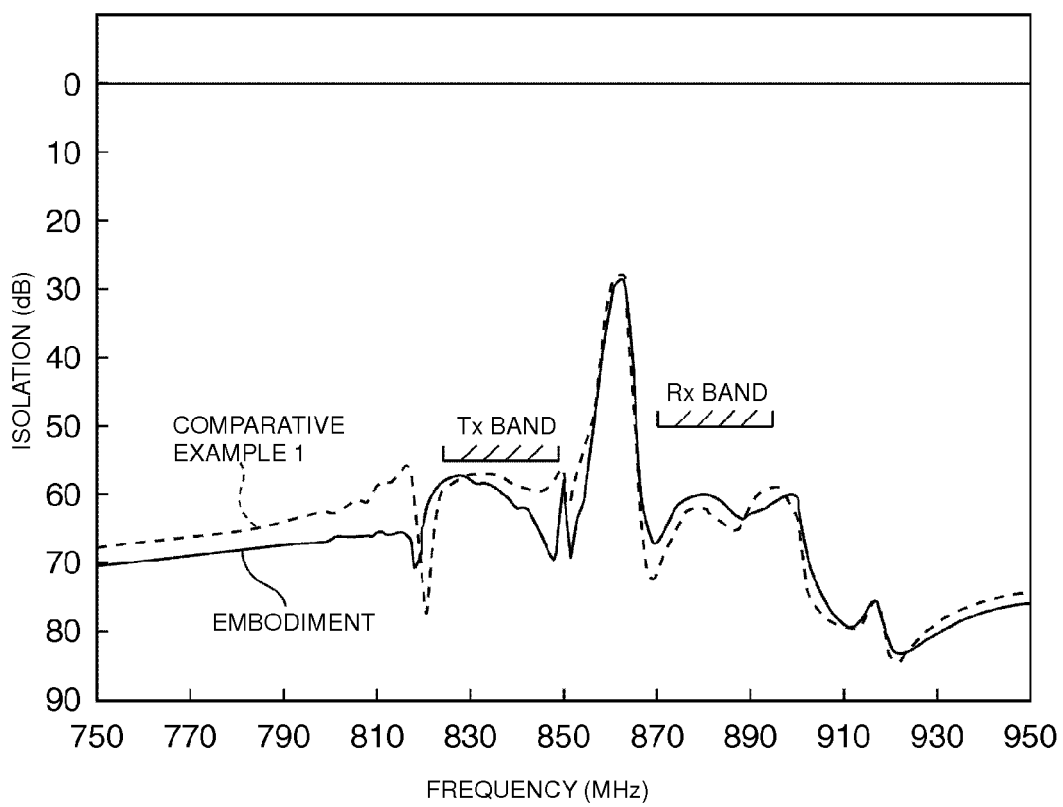
FIG. 7 is a graph showing the isolation characteristic between a transmission signal terminal and a first reception signal terminal, of each of the duplexer according to the first preferred embodiment of the present invention and the duplexer according to the comparative example.
Figure 8:
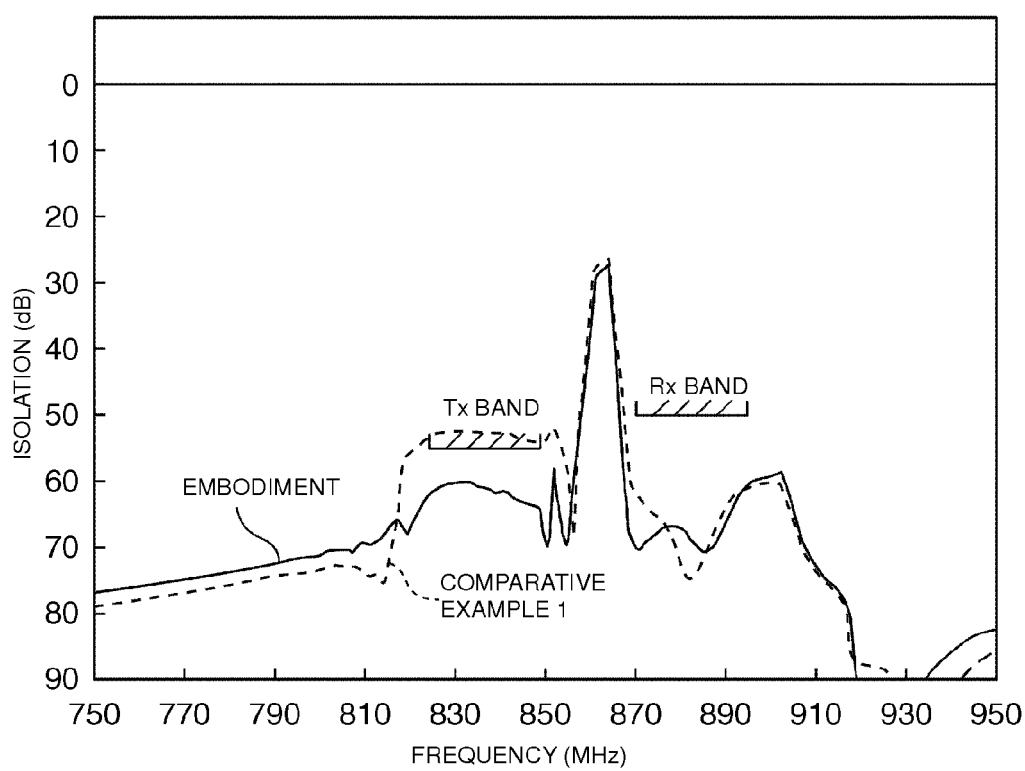
FIG. 8 is a graph showing the isolation characteristic between the transmission signal terminal and a second reception signal terminal, of each of the duplexer according to the first preferred embodiment of the present invention and the duplexer according to the comparative example.

FIG. 6 shows the differential isolation characteristics from the transmission signal terminal to first and second reception signal terminals, of each of the duplexer according to the present preferred embodiment and the duplexer according to the comparative example. FIG. 7 shows the isolation characteristic from the transmission signal terminal to the first reception signal terminal of each of the duplexer according to the present preferred embodiment and the duplexer according to the comparative example. FIG. 8 shows the isolation characteristic from the transmission signal terminal to the second reception signal terminal of each of the duplexer according to the present preferred embodiment and the duplexer according to the comparative example. Table 1 below shows the minimum insertion loss in the transmission filter passband (TX band: about 824 MHz to about 849 MHz) and that in the reception filter passband (RX band: about 869 MHz to about 894 MHz) of each of this preferred embodiment and the comparative example. In Table 1, "TX→RX1 isolation" refers to the isolation characteristic from the transmission signal terminal 14 to the first reception signal terminal 15a. "TX→RX2 isolation" refers to the isolation characteristic from the transmission signal terminal 14 to the second reception signal terminal 15b.

TABLE 1

| | Differential isolation (dB) | | Tx → Rx1 isolation (dB) | | Tx → Rx2 isolation (dB) | |
|---|---|---|---|---|---|---|
| | Tx band | Rx band | Tx band | Rx band | Tx band | Rx band |
| Embodiment | 64.3 | 59.5 | 57.8 | 59.9 | 60.0 | 61.6 |
| Comparative example | 59.4 | 58.5 | 57.0 | 59.1 | 52.6 | 60.7 |

As is apparent from FIG. 6 and the result shown in the above-mentioned Table 1, the duplexer 1 according to the present preferred embodiment has a better differential isolation characteristic than the duplexer 100 according to comparative example. Particularly, in the TX band, the differential isolation in the present preferred embodiment was better by about 4.9 dB than that in the comparative example.

As is apparent from the results shown in FIGS. 7 and 8, it is understood that the duplexer 1 according to the present preferred embodiment is better than the duplexer 100 according to the comparative example in both the isolation characteristic from the transmission signal terminal 14 to the first reception signal terminal 15a and the isolation characteristic from the transmission signal terminal 14 to the second reception signal terminal 15b. Particularly, with regard to the isolation characteristic from the transmission signal terminal 14 to the second reception signal terminal 15b, the present preferred embodiment is better by as much as about 7.4 dB than the comparative example.

From the above-mentioned result, it is understood that use of the configuration where the transmission signal propagation direction D3 is perpendicular or substantially perpendicular to each of the first reception signal propagation direction D4 and the second reception signal propagation direction D5 can improve the isolation characteristics between the transmission signal terminal 14 and the first reception signal terminal 15a and the second reception signal terminal 15b. That is, by arranging the transmission signal propagation direction D3 perpendicular or substantially perpendicular to each of the first reception signal propagation direction D4 and the second reception signal propagation direction D5, as well as by forming the ladder-type elastic wave filter unit 11a into an elongated shape whose length direction extends along the transmission signal propagation direction D3 and forming the longitudinally coupled resonator-type elastic wave filter unit 30 into an elongated shape whose length direction extends along the elastic wave propagation direction D2, the isolation characteristic can be favorably maintained even when performing miniaturization by disposing the ladder-shaped elastic wave filter chip 11a and the longitudinally coupled resonator-type elastic wave filter unit 30 such that the respective length directions thereof are parallel or substantially parallel with each other.

The following reasons are conceivable as the reason why these advantages are obtained.

At the frequencies of the TX band, the ladder-type elastic wave filter unit 11a serving as a transmission filter unit typically has an impedance close to about 50Ω, for example. Thus, signals strongly flow from the transmission signal terminal 14 toward the antenna terminal 13. In this case, when electromagnetic coupling occurs between the ladder-type elastic wave filter unit 11a serving as a transmission filter unit and the longitudinally coupled resonator-type elastic wave filter unit 30 serving as a reception filter unit, signals flow also in the longitudinally coupled resonator-type elastic wave filter unit 30 in the same direction as the transmission signal propagation direction D3. In the duplexer 100 shown in FIG. 5, the transmission signal propagation direction D3 and the second reception signal propagation direction D5 are the same direction. Thus, when signals flow from the transmission signal terminal 14 toward the antenna terminal 13, signals flow from the input signal terminal 31 toward the second output signal terminal 32b. As a result, signals flow from the antenna terminal 13 toward the second reception signal terminal 15b. This results in crosstalk, deteriorating the isolation characteristic between the transmission signal terminal 13 and the second reception signal terminal 15b in the TX band.

On the other hand, in the duplexer 1 according to the present preferred embodiment, the transmission signal propagation direction D3 does not agree with any of the first reception signal propagation direction D4 and the second reception signal propagation direction D5. Specifically, the transmission signal propagation direction D3 is perpendicular or substantially perpendicular to each of the first reception signal propagation direction D4 and the second reception signal propagation direction D5. Thus, when signals flow from the transmission signal terminal 14 toward the antenna terminal 13, the flow of signals from the input signal terminal 31 toward the first output signal terminal 32a and the second output signal terminal 32b is significantly reduced and prevented. This results in significant reduction and prevention of crosstalk, favorably maintaining the isolation characteristics between the transmission signal terminal 13 and the first reception signal terminal 15a and the second reception signal terminal 15b in the TX band.

Further, in the present preferred embodiment, the piezoelectric substrate 22 of the longitudinally coupled resonator-type elastic wave filter chip 12 and the piezoelectric substrate 20 of the ladder-type elastic wave filter chip 11 are provided separately. Thus, crosstalk can be significantly reduced and prevented more effectively, obtaining a better isolation characteristic.

In the duplexer 2 according to the reference example shown in FIG. 9, the longitudinally coupled resonator-type elastic wave filter chip 12 is disposed such that an elastic wave propagation direction D1 and an elastic wave propagation direction D2 are parallel or substantially parallel with each other and that a transmission signal propagation direction D3 is opposite to a first reception signal propagation direction D4 and a second reception signal propagation direction D5.

Accordingly, also in this case, the transmission signal propagation direction D3 differs from the first reception signal propagation direction D4 and the second reception signal propagation direction D5. Thus, as in the above-mentioned first preferred embodiment, a good isolation characteristic can be obtained. However, as described above, in the duplexer 2, the ladder-shaped elastic wave filter chip 11 and the longitudinally coupled resonator-type elastic filter chip 12 are disposed such that the respective length directions thereof are perpendicular or substantially perpendicular to each other. This results in an increase in the area where the ladder-type elastic wave filter chip 11 and the longitudinally coupled resonator-type elastic wave filter chip 12 are disposed, which is disadvantageous in miniaturization.

Hereafter, a modification of a preferred embodiment of the present invention will be described. In the description below, components having substantially the same functions as those in the above-mentioned preferred embodiment are referred to using the same numerals, and description thereof is omitted. In the modification, FIGS. 1 and 2 are referred to, as in the first preferred embodiment.

Modified Preferred Embodiment

While the example where the ladder-type elastic wave filter chip 11 and the longitudinally coupled resonator-type elastic wave filter chip 12 are filter chips using surface acoustic waves has been described in the above-mentioned first preferred embodiment, the present invention is not limited to such a configuration.

Figure 10:
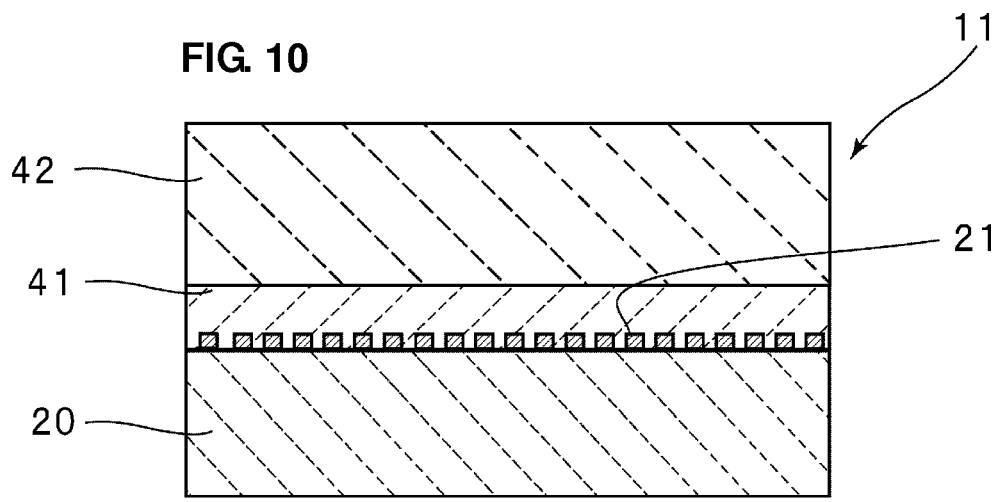
FIG. 10 is a schematic cross-sectional view of a ladder-type elastic wave filter chip according to a modification.

The ladder-type elastic wave filter chip 11 and the longitudinally coupled resonator-type elastic wave filter chip may be boundary acoustic wave filter chips using boundary acoustic waves. FIG. 10 is a schematic cross-sectional view of a ladder-type elastic wave filter unit according to this modification. As shown in FIG. 10, a ladder-type elastic wave filter chip 11 includes a first dielectric layer 41 and a second dielectric layer 42 provided on a piezoelectric substrate 20 in a manner covering an electrode structure 21. The first dielectric layer 41 has a lower sonic speed than the second dielectric layer 42. The first dielectric layer 41 may be formed using, for example, silicon oxide or other suitable material. The second dielectric layer 42 may be formed using silicon nitride or other suitable material. Although not shown, a longitudinally coupled resonator-type elastic wave filter chip 12 according to this modification also includes first and second dielectric layers provided on a piezoelectric substrate 22 in a manner covering an electrode structure 23, as with the ladder-type elastic wave filter chip 11.

While the example where the longitudinally coupled resonator-type elastic wave filter unit 30 is a balanced filter unit with the balanced-unbalanced transforming function has been described in the above-mentioned first preferred embodiment, the longitudinally coupled resonator-type elastic wave filter unit may be an unbalanced filter unit without the balanced-unbalanced transforming function. In this case, the first output signal terminal 32a and the second output signal terminal 32b are combined into a single output signal terminal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A branching filter comprising:
    an antenna terminal;
    a transmission signal terminal;
    a reception signal terminal;
    a ladder-type elastic wave filter unit connected between the antenna terminal and the transmission signal terminal; and
    a longitudinally coupled resonator-type elastic wave filter unit connected between the antenna terminal and the reception signal terminal; wherein
    the ladder-type elastic wave filter unit comprises:
        a plurality of series arm resonators connected in series with each other between the antenna terminal and the transmission signal terminal, the series arm resonators defining a series arm; and
        a parallel arm resonator connected between the series arm and a ground potential;
    the longitudinally coupled resonator-type elastic wave filter unit comprises first and second functional electrode units, the first and second functional electrode units each comprising at least one IDT electrode connected between the antenna terminal and the reception signal terminal;
    a transmission signal propagation direction that is perpendicular or substantially perpendicular to an elastic wave propagation direction in the series arm resonators is perpendicular or substantially perpendicular to each of a first reception signal propagation direction that is perpendicular or substantially perpendicular to an elastic wave propagation direction in the first functional electrode unit and a second reception signal propagation direction that is perpendicular or substantially perpendicular to an elastic wave propagation direction in the second functional electrode unit;
    the ladder-type elastic wave filter unit has an elongated shape whose length direction extends along the transmission signal propagation direction;
    the longitudinally coupled resonator-type elastic wave filter unit has an elongated shape whose length direction extends along the elastic wave propagation directions in the first and second functional electrode units;
    the ladder-type elastic wave filter unit further comprises a piezoelectric substrate including the series arm resonators and the parallel arm resonator provided thereon;
    the longitudinally coupled resonator-type elastic wave filter unit further comprises a piezoelectric substrate including the first and second functional electrode units provided thereon;
    the piezoelectric substrate of the ladder-type elastic wave filter unit has a rectangular or substantially rectangular shape whose length direction extends along the transmission signal propagation direction; and
    the piezoelectric substrate of the longitudinally coupled resonator-type elastic wave filter unit has a rectangular or substantially rectangular shape whose length direction extends along the elastic wave propagation directions in the first and second functional electrode units.

2. The branching filter according to claim 1, wherein the first functional electrode unit comprises a first longitudinally coupled resonator-type elastic wave element unit comprising a plurality of IDT electrodes disposed in an elastic wave propagation direction;
    the second functional electrode unit comprises a second longitudinally coupled resonator-type elastic wave element unit comprising a plurality of IDT electrodes disposed along an elastic wave propagation direction; and
    the first and second longitudinally coupled resonator-type elastic wave element units are disposed along the elastic wave propagation directions in the first and second longitudinally coupled resonator-type elastic wave element units.

3. The branching filter according to claim 2, wherein the reception signal terminal comprises first and second reception signal terminals;
the first functional electrode unit further comprises a third longitudinally coupled resonator-type elastic wave element unit, the third longitudinally coupled resonator-type elastic wave element unit being cascade-connected between the first longitudinally coupled resonator-type elastic wave element unit and the first reception signal terminal and disposed on one side of the first longitudinally coupled resonator-type elastic wave element unit in the first reception signal propagation direction; and
the second functional electrode unit further comprises a fourth longitudinally coupled resonator-type elastic wave element unit, the fourth longitudinally coupled resonator-type elastic wave element unit being cascade-connected between the second longitudinally coupled resonator-type elastic wave element unit and the second reception signal terminal and disposed on one side of the second longitudinally coupled resonator-type elastic wave element unit in the second reception signal propagation direction.

4. The branching filter according to claim 1, wherein the reception signal terminal comprises first and second reception signal terminals; and
the first functional electrode unit is connected between the antenna terminal and the first reception signal terminal, and the second functional electrode unit is connected between the antenna terminal and the second reception signal terminal.

5. The branching filter according to claim 1, wherein the series arm resonators and the parallel arm resonator are disposed along the transmission signal propagation direction.

* * * * *